US012563725B2

(12) United States Patent (10) Patent No.: US 12,563,725 B2
Thimmegowda et al. (45) Date of Patent: Feb. 24, 2026

(54) PARALLEL STAIRCASE 3D NAND

(71) Applicant: Intel NDTM US LLC, Santa Clara, CA (US)

(72) Inventors: Deepak Thimmegowda, Fremont, CA (US); Chang Wan Ha, San Ramon, CA (US); Md Rezaul Karim Nishat, Santa Clara, CA (US); Liu Liu, Dalian (CN); Yuanrong Shui, Dalian (CN); Kwame Eason, East Palo Alto, CA (US); Ahmed Reza, San Jose, CA (US); Hoon Koh, San Jose, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 839 days.

(21) Appl. No.: 17/559,725

(22) Filed: Dec. 22, 2021

(65) Prior Publication Data

US 2023/0200063 A1 Jun. 22, 2023

(51) Int. Cl.
| | |
|---|---|
| *H10B 43/20* | (2023.01) |
| *G11C 8/14* | (2006.01) |
| *G11C 16/04* | (2006.01) |
| *H01L 23/48* | (2006.01) |
| *H10B 41/10* | (2023.01) |
| *H10B 41/20* | (2023.01) |
| *H10B 41/35* | (2023.01) |
| *H10B 43/10* | (2023.01) |
| *H10B 43/35* | (2023.01) |

(52) U.S. Cl.
CPC ............... *H10B 43/20* (2023.02); *G11C 8/14* (2013.01); *G11C 16/0483* (2013.01); *H01L 23/481* (2013.01); *H10B 41/10* (2023.02); *H10B 41/20* (2023.02); *H10B 41/35* (2023.02); *H10B 43/10* (2023.02); *H10B 43/35* (2023.02)

(58) Field of Classification Search
CPC ........ H10B 43/20; H10B 41/10; H10B 41/20; H10B 41/35; H10B 43/10; H10B 43/35; H10B 41/50; H10B 43/50; H10B 41/27; H10B 43/27; G11C 8/14; G11C 16/0483; H01L 23/481
See application file for complete search history.

(56) References Cited

U.S. PATENT DOCUMENTS

| | | | | |
|---|---|---|---|---|
| 9,589,978 B1* | 3/2017 | Yip | ......................... | H10B 43/40 |
| 2018/0331034 A1* | 11/2018 | Thimmegowda | ...... | H10B 63/30 |
| 2021/0296335 A1* | 9/2021 | Sun | ......................... | H10B 41/27 |
| 2022/0392550 A1* | 12/2022 | Wan | .................... | G11C 16/0483 |

* cited by examiner

*Primary Examiner* — Karen Kusumakar
(74) *Attorney, Agent, or Firm* — Morgan, Lewis & Bockius LLP

(57) ABSTRACT

Systems, apparatuses, and methods may provide for technology that arranges stair wells for memory devices. The memory device includes a memory array and a memory block coupled to the memory array. The memory block includes a first through array via area and a first staircase area coupled to a plurality of decks. The first staircase area includes a first stair well and a second stair well located contiguous to the first stair well.

20 Claims, 9 Drawing Sheets

700

Forming a memory array including a first through via area, and a first staircase area coupled to a plurality of decks and positioned adjacent to the first through array via area; where the first staircase area includes a first stairwell and a second stairwell located contiguous to the first stairwell

702

Forming a memory array coupled to the memory block

704

800

PARALLEL STAIRCASE 3D NAND

TECHNICAL FIELD

Embodiments generally relate to memory structures. More particularly, embodiments relate to a parallel staircase arrangement utilized in memory structures.

BACKGROUND

NAND-type flash memory ("NAND memory") may be organized into multiple cells, with each cell containing one or more bits of data and being accessible through an array of bit lines (columns) and word lines (rows). With the increase of number of tiers or word lines (WL) in 3D NAND in every generation, the number of WL contacts is also going up, requiring more routing paths to hook up the word line contacts to corresponding string driver complementary metal-oxide-semiconductor (CMOS) devices.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
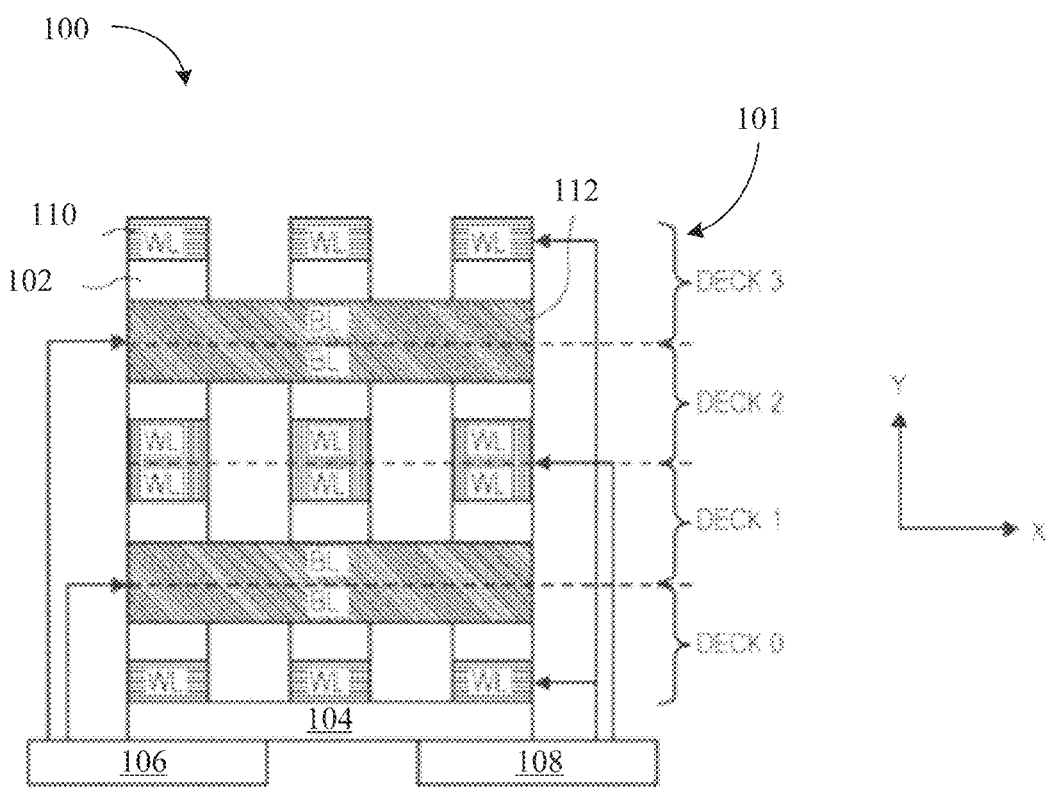
FIG. 1 is a block diagram of an example of a multi-deck non-volatile memory device according to an embodiment.

As described above, NAND-type flash memory ("NAND memory") may be organized into multiple cells, with each cell containing one or more bits of data and being accessible through an array of bit lines (columns) and word lines (rows). With the increase of number of tiers or word lines (WL) in 3D NAND in every generation, the number of word line contacts is also going up, requiring more routing paths to hook up the word line contacts to corresponding string driver complementary metal-oxide-semiconductor (CMOS) devices.

In existing staircase cell floor plans for 3D NAND, string driver CMOS device contacts (Con3) and word line contacts are placed separately (serial position in Y-direction), and the metal lines are routed vertically to connect them. The word line contacts are placed in a staircase (SC) region and string driver CMOS device contacts are placed in a Through Array Via (TAV) region. And to accommodate more contacts and metal routers, the cell length typically goes up, which results in bigger die size.

In existing staircase cell floor plans for 3D NAND, the existing "serial" design (e.g., where string driver CMOS device contacts (Con3) and word line contacts are placed separately in a serial position and the metal lines are routed vertically to connect them) has no solution apart from increasing the die size. One existing idea was to increase a "block pitch" or "block height" to place more contacts in an X-direction. But placing more contacts in the X-direction limits the space for metal routing in the Y-direction, which eventually ends up increasing the cell height, hence also increasing the die size.

As will be descried in greater detail below, systems, apparatuses, and methods described herein may provide for technology that arranges stair wells for memory devices. The memory device includes a memory array and a memory block coupled to the memory array. The memory block includes a first through array via area and a first staircase area coupled to a plurality of decks and positioned adjacent to the first through array via area. The first staircase area includes a first stair well and a second stair well located contiguous to the first stair well.

For example, the arrangement of stair wells for memory devices described herein places the word line contacts and string driver device contacts side by side (which is referred to herein as a "parallel staircase" arrangement. Basically, a staircase region and through array via regions are placed in parallel. Such a parallel staircase arrangement doesn't increase the number of masks needed to create the staircase to access word lines as compared to existing designs. Also, because the word line contacts and string driver device contacts are side by side in an X-direction, metals can be routed horizontally (e.g., instead of vertically) to hook them up. Overall, such implementations reduce the cell length significantly, and hence such implementations also reduce die size.

In some implementations, the arrangement of stair wells for memory devices described herein permit for scaling of a staircase region in 3D NAND. For example, a word line exit region (e.g., which includes a staircase trim etch chops, plus formation of contacts, and plus routing) negative impact for the floating gate (FG) tech node areal density increases with a greater number of tiers in 3D NAND. A word line exit region may consume more and more silicon area as 3D NAND technology becomes more advanced (e.g., by increasing more tiers vertically), especially considering that such word line exit regions are fundamentally non-active user cell bits region (e.g., which negatively impacts areal density). This problem will keep on growing unless the word line exit access is addressed. Accordingly, some implementations described herein reimagine staircase design to include the interconnect (e.g., metal router/Con3) location in addition to other advances in staircase development (e.g., hard mask, stairwell, chop zones advances). As will be described in greater detail below, the parallel staircase implementations described may cut down the word line exit overhead. This is especially true for future advances where the number of tiers keep increasing node to node.

FIG. 1 is a block diagram of an example of a memory device 100 according to an embodiment. As illustrated, the memory device 100 is a multi-deck non-volatile memory device including a plurality of decks 101 (e.g., Deck 0, Deck 1, Deck 2, and Deck 3, or the like).

In some implementations, each of the decks 101 may include an array of memory cells 102 with conductive access lines (e.g., word lines 110 and bitlines 112). For example, the memory cells 102 may include a material capable of being in two or more stable states to store a logic value. In one example, the memory cells 102 may include a phase change material, a chalcogenide material, the like, or combinations thereof. However, any suitable storage material may be utilized. The word lines 110 and bitlines 112 may be patterned so that the word lines 110 are orthogonal to the bitlines 112, creating a grid pattern or "cross-points." A cross-point is an intersection between a bitline, a word line, and active material(s) (e.g., a selector and/or a storage material). A memory cell 102 may be located at the intersection of a bitline 112 and a word line 110. Accordingly, one or more of the decks 101 may include a crosspoint array of non-volatile memory cells, where each of the memory cells may include a material capable of being in two or more stable states to store a logic value.

As illustrated, an electrically isolating material 104 may separate the conductive access lines (e.g., word lines 110 and bitlines 112) of the bottom deck (e.g., deck 0) from bitline sockets 106 and word line sockets 108. For example, the memory cells 102 may be coupled with access and control circuitry for operation of the three-dimensional memory device 100 via the bitline sockets 106 and the word line sockets 108.

Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

The memory device 100 may include non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices.

As will be described in greater detail below, systems, apparatuses and methods of some implementations herein provide for technology that arranges stair wells for memory devices.

Figure 2:
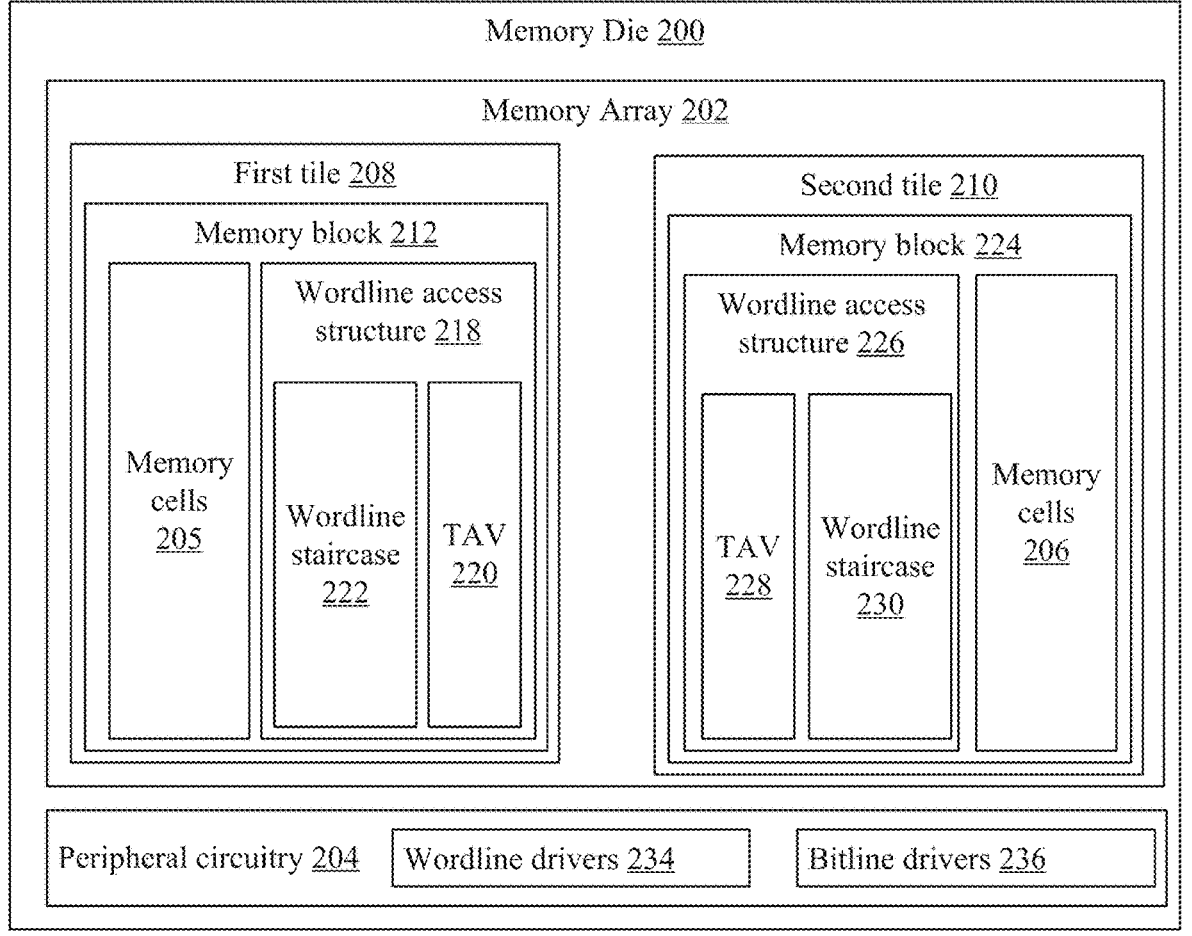
FIG. 2 illustrates an example side view diagram of a memory die according to an embodiment.

FIG. 2 illustrates a simplified example side view diagram of a memory die 200, consistent with one embodiment of the present disclosure. The memory die 200 includes a 3D flash memory architecture and utilizes a word line bridge to share word line access structures between two tiles of a memory array, according to one embodiment.

The memory die 200 includes a memory array 202 and peripheral circuitry 204, according to one embodiment. The memory array 202 includes memory cells 205 and memory cells 206 that are accessed (e.g., read/write) with the peripheral circuitry 204, according to one embodiment. The peripheral circuitry 204 is fabricated at least partially under the memory array 202 in the memory die 200, for example, using CMOS under the array fabrication techniques, according to one embodiment.

The memory array 202 is segmented into a first tile 208 and a second tile 210, according to one embodiment. Although two tiles are illustrated and described the memory array 202 may be segmented into 10's or 100's of tiles to facilitate access and operation of the memory array 202, according to one embodiment. The first tile 208 includes a memory block 212, which includes the memory cells 205 and word line access structures 218, according to one embodiment. The word line access structures 218 include through array vias 220 and a word line staircase 222, according to one embodiment. The through array vias 220 connect word lines for the memory cells 205 to the peripheral circuitry 204, under the memory array 202, according to one embodiment. The word line staircase 222 represents a word line staircase structure that may be used to connect the word lines of the memory cells 205 to metal contacts for connection to upper metal levels, according to one embodiment. The word line access structures 218 are illustrated disproportionately large in comparison to the memory cells 205 for illustration purposes. In practice, the memory cells 205 may occupy a significantly larger area in the memory array that the word line access structures 218, according to one embodiment.

The second tile 210 includes a memory block 224, which includes the memory cells 206 and word line access structures 226, according to one embodiment. The word line access structures 226 include through array vias 228 and a word line staircase 230, according to one embodiment. The through array vias 228 pass through the memory block 224 to couple upper metal levels to the peripheral circuitry 204, according to one embodiment. The word line staircase 230 provides landings and/or a structure to which metal contacts connect the word lines of the memory cells 206 to upper metal levels that are on top of or above the memory array 202, according to one embodiment.

The peripheral circuitry 204 includes word line drivers 234 and bitline drivers 236 that drive word lines and bitlines for the memory array 202, according to one embodiment.

Figure 3:
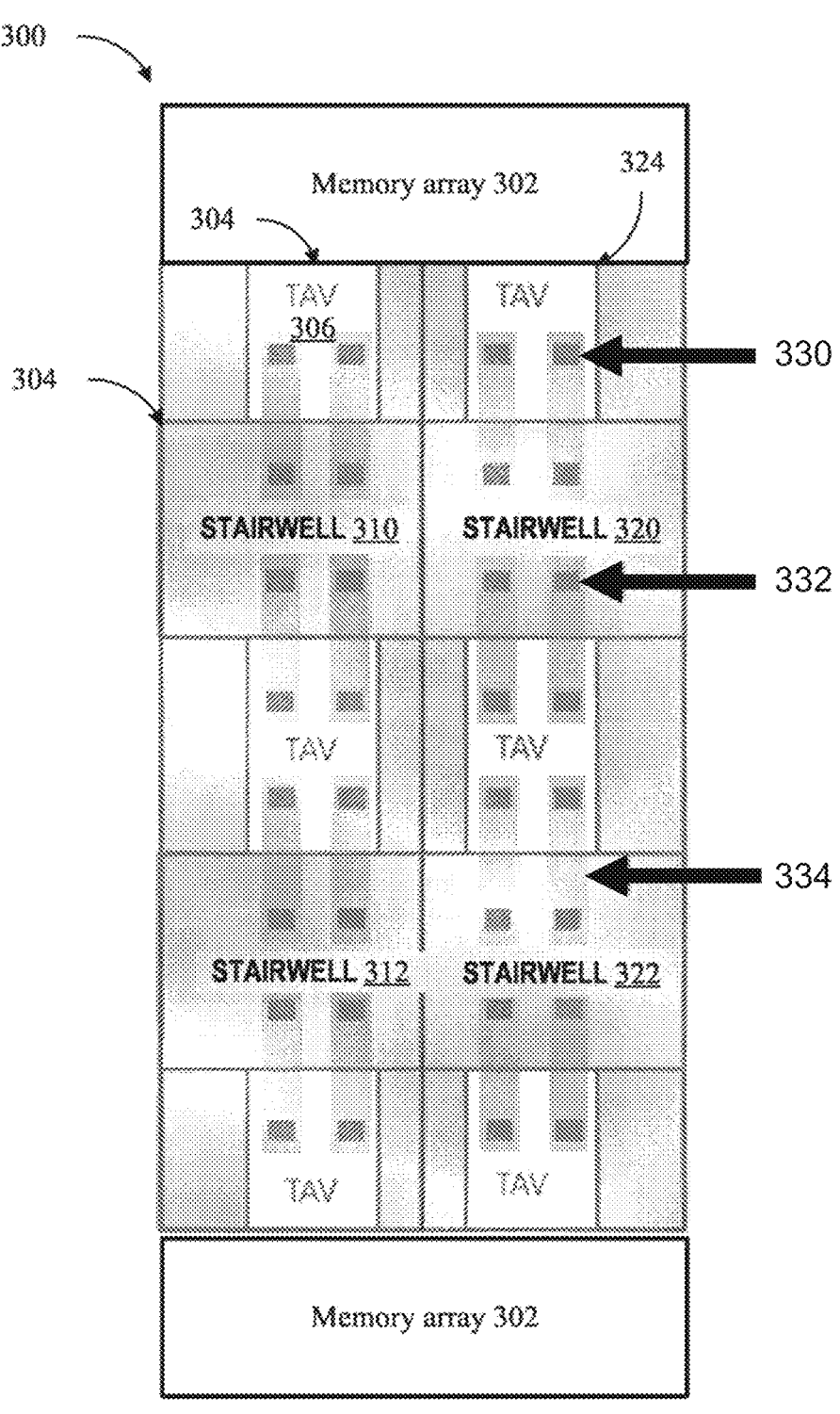
FIG. 3 is a block diagram of an example existing memory device.

FIG. 3 is a block diagram of an example existing memory device 300. As will be described in greater detail below, memory device 300 is limited to a total of two stair wells per memory block. Further, every stair well has word line contacts landing on each and every deck (e.g., all three decks in some implementations). Additionally, the stair wells and through array vias (TAV) are placed in serial positions.

As illustrated, the memory device 300 includes a memory array 302 and a memory block 304 coupled to the memory array 302. Each memory block (e.g., memory block 304 and memory block 324) is limited to a total of two stair wells (e.g., stair wells 310/312 for memory block 304 and stair wells 320/322 for memory block 324) per memory block.

A plurality of metal routers 334 individually connect a plurality of word line contacts 432 to a plurality of string driver contacts 430. As illustrated, every stair well has word line 332 contacts landing on each and every deck (e.g., all three decks in some implementations). Additionally, the stair wells and through array vias (e.g., TAVs 306) are placed in serial positions (e.g., where a stairwell is interspersed between each sequential pair of TAVs).

Additional details regarding the existing memory device 300 are discussed below with respect to FIG. 5

Figure 4:
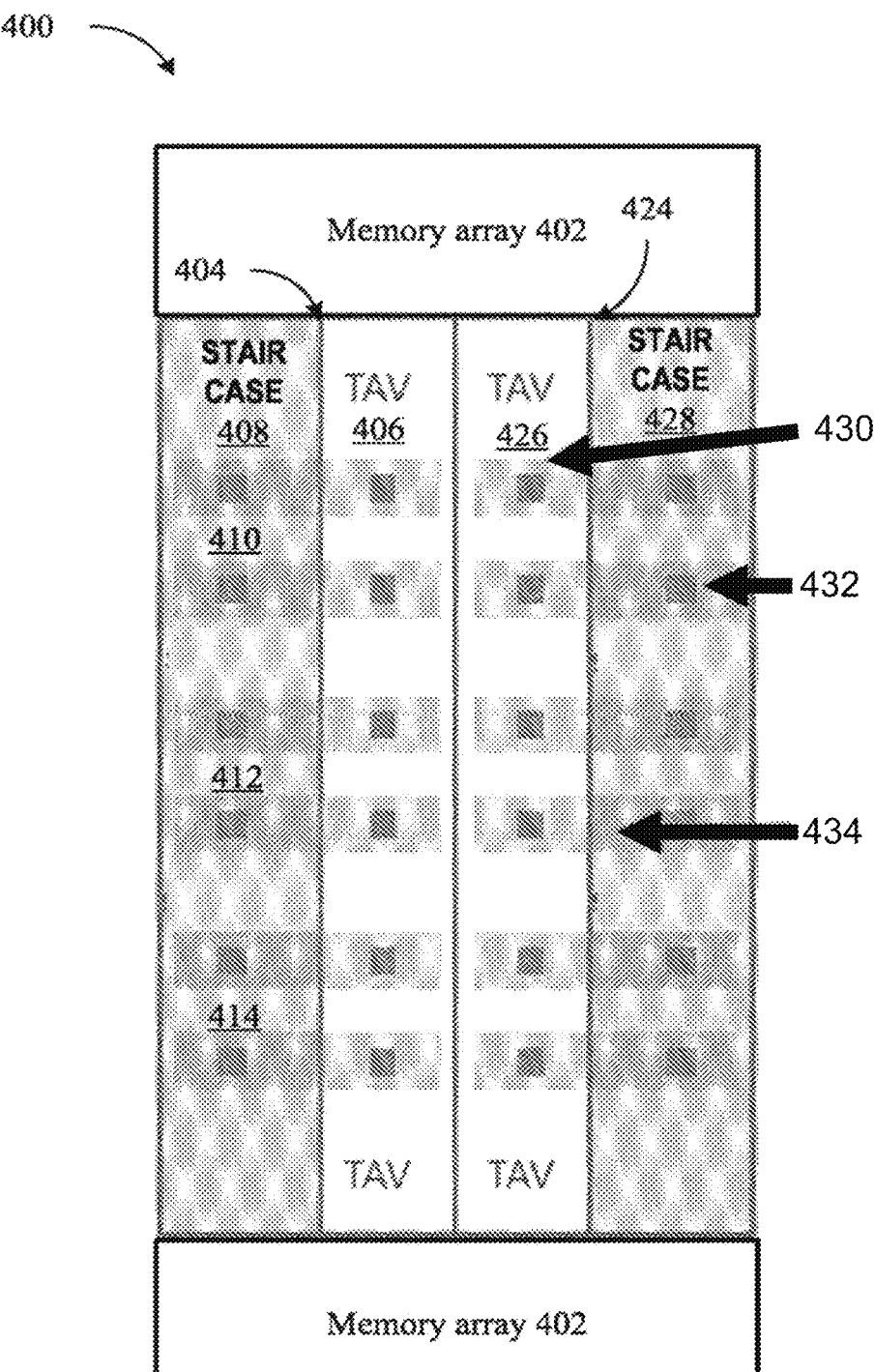
FIG. 4 is a block diagram of an example memory device according to an embodiment.

FIG. 4 is a block diagram of an example memory device 400 according to an embodiment. As will be described in greater detail below, the memory device 400 differs from the existing memory device 300 in several ways. For example, the memory device 400 includes more than two stair wells (e.g., three stair wells in the illustrated example). Further, the plurality of stairwells have word line contacts that land on only one deck (e.g., one stair well per deck). Additionally, the stair wells and through array vias (TAV) are placed side-by-side in parallel position.

As illustrated, the memory device 400 includes a memory array 402 and a memory block 404 coupled to the memory array 402.

In some implementations, the memory block includes a first through array via area 406 and a first staircase area 408. The first staircase area 408 is coupled to a plurality of decks (e.g., Deck, 0, Deck 1, etc. of FIG. 1) and positioned adjacent to the first through array via area 406.

The first staircase area 408 includes a first stair well 410 and a second stair well 412 located contiguous to the first stair well 410. In some implementations, the first staircase area 408 comprises a third stair well 414 located contiguous to the first stair well 410 and the second stair well 412.

In some examples, the first stair well 410 is coupled exclusively to a first one of the plurality of decks (e.g., Deck 0 of FIG. 1). In such an example, the second stair well 412 is coupled exclusively to a second one of the plurality of decks (e.g., Deck 1 of FIG. 1). The second stair well 412 is a different stair well than the first stair well 410 and the second one of the plurality of decks (e.g., Deck 1 of FIG. 1) is a different deck than the first one of the plurality of decks. (e.g., Deck 0 of FIG. 1).

In some implementations, memory device 400 includes a second memory block 424 coupled to the memory array 402. The second memory block 424 includes a second through array via area 426 and a second staircase area 428. In such an implementation, the second staircase area 428 is coupled to the plurality of decks (e.g., Deck, 0, Deck 1, etc. of FIG. 1) and positioned adjacent to the second through array via area 426.

In some examples, the first and second staircase areas 408/428 and the first and second through array via areas 406/426 form a sandwich structure. Such a sandwich structure has the first and second staircase areas 408/428 located on an outside of the sandwich and the first and second through array via areas 406/426 positioned adjacent one another on an inside of the sandwich.

Similarly, in some implementations, the first and second staircase areas 408/428 and the first and second through array via areas 406/426 extend parallel to one another and perpendicular to the memory array 402.

In some examples, the first through array via area 406 comprises a plurality of string driver contacts 430 and the first staircase area 408 comprises a plurality of word line contacts 432. In such an example a plurality of metal routers 434 individually connect the plurality of word line contacts 432 to the plurality of string driver contacts 430. As illustrated, the plurality of metal routers 434 extend parallel to the memory array 402.

Additional details regarding memory device 400 are discussed below with respect to FIG. 6.

Figure 5:
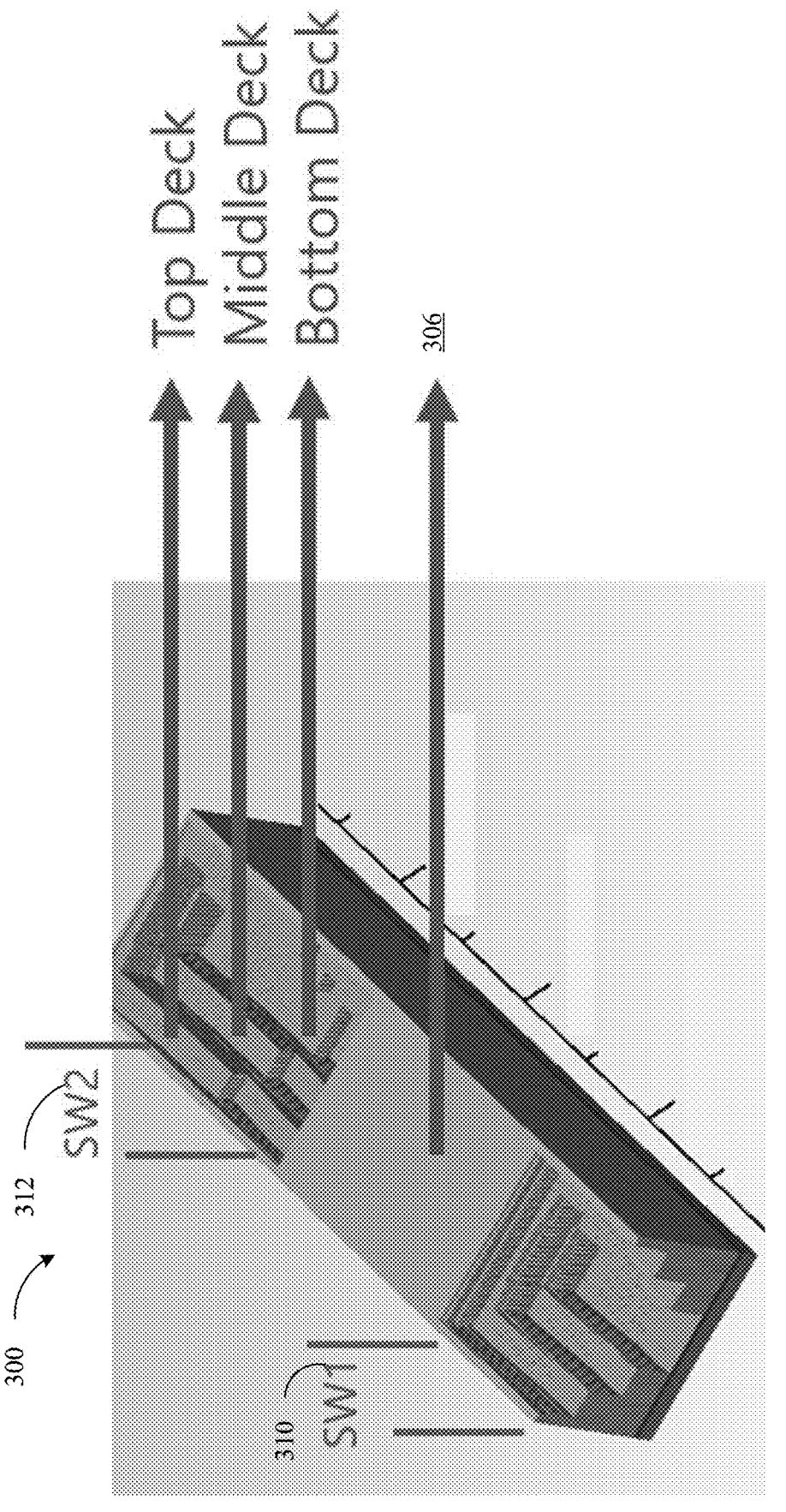
FIG. 5 is a perspective view of an existing staircase area.

FIG. 5 is a perspective view of an existing staircase area of the existing memory device 300. As illustrated, the existing memory device 300 is limited to a total of two stair wells (e.g., stair wells 310/312) per memory block. Further, every stair well has word line contacts landing on each and every deck (e.g., a top deck, a middle deck, and a bottom deck in some implementations). Additionally, the stair wells 310/312 and through array vias (TAV 306) are placed in serial positions (e.g., where a TAV 306 is interspersed between each sequential pair of stairwells 310/312).

Figure 6:
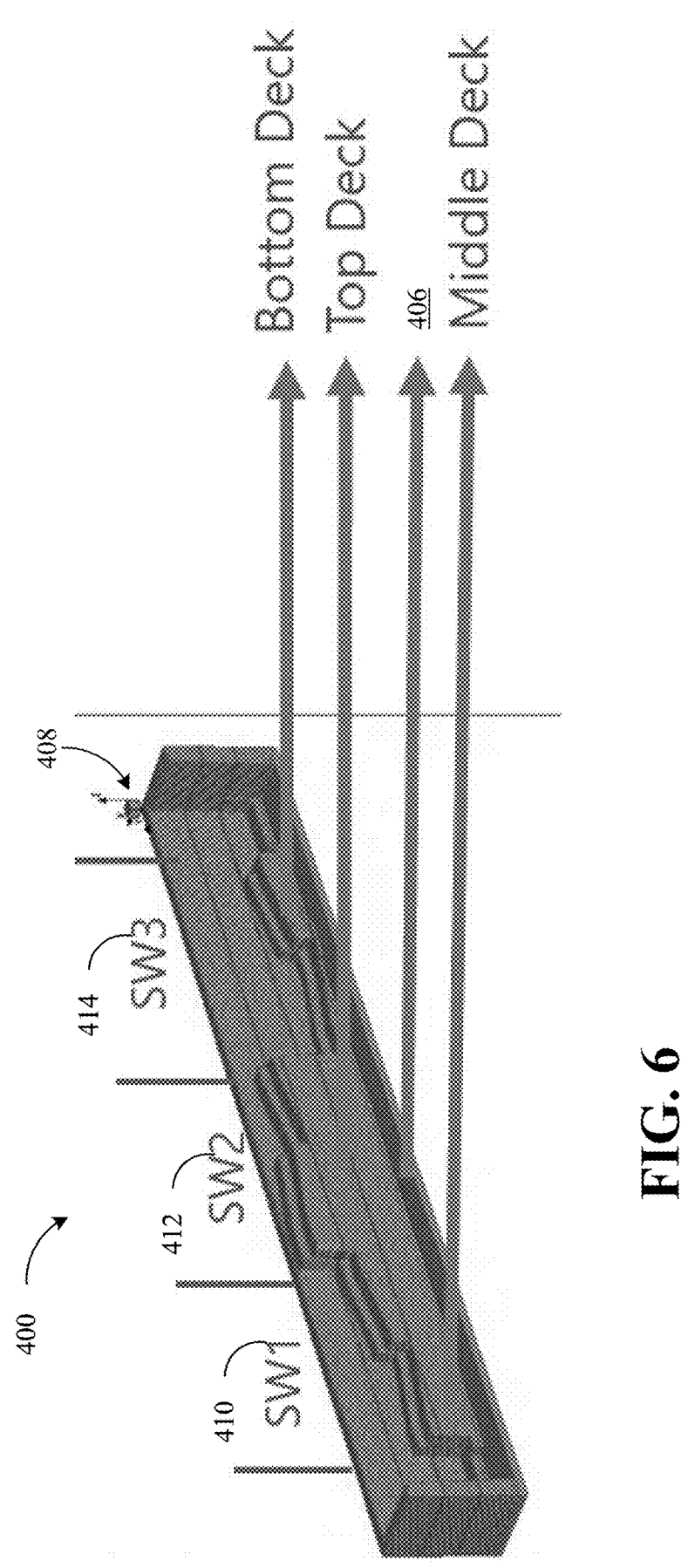
FIG. 6 is a perspective view of a staircase area according to an embodiment.

FIG. 6 is a perspective view of the staircase area 408 of the memory device 400 according to an embodiment. As discussed above, the memory device 400 differs from the existing memory device 300 in several ways. For example, the memory device 400 includes more than two stair wells (e.g., the first stair well 410, the second stair well 412, and the third stair well 414 in the illustrated example). Further, the first stair well 410, the second stair well 412, and the third stair well 414 each have word line contacts that land on only one deck (e.g., one stair well is associated with each of a top deck, a middle deck, and a bottom deck). Additionally, the first stair well 410, the second stair well 412, and the third stair well 414 are placed side-by-side in parallel position to the TAV 406.

Figure 7:
FIG. 7 is a flowchart of an example of another method of forming a memory device according to an embodiment.

FIG. 7 is a flowchart of an example of a method 700 of forming a memory device according to an embodiment. The method 700 may generally be implemented to form a memory device, such as, for example, the memory device 400 (e.g., see FIG. 4), already discussed.

Illustrated processing block 702 provides for forming a memory block. For example, the memory block includes a first through array via area and a first staircase area. In such an implementation the first staircase area is coupled to a plurality of decks and positioned adjacent to the first through array via area. The first staircase area includes a first stair well and a second stair well located contiguous to the first stair well.

Illustrated processing block 704 provides for forming a memory array. For example, the memory array is coupled to the memory block.

Additionally, in some implementations, the method 700 further includes operations to form a second memory block coupled to the memory array. In such an implementation the second memory block includes a second through array via area and a second staircase area. The second staircase area is coupled to the plurality of decks and positioned adjacent to the second through array via area.

Additional details regarding the various implementations of method 700 are discussed below with regard to FIGS. 8 and 9.

Figure 8:
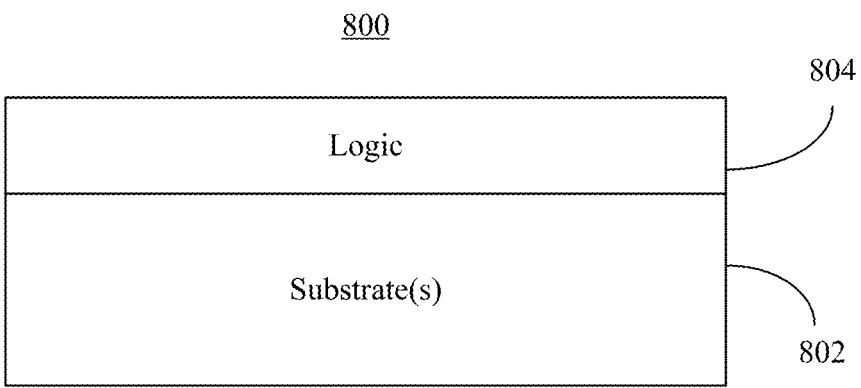
FIG. 8 is an illustration of an example of a semiconductor package apparatus according to an embodiment.

FIG. 8 shows a semiconductor apparatus 800 (e.g., chip, die, and/or package). The illustrated apparatus 800 includes one or more substrates 802 (e.g., silicon, sapphire, gallium arsenide) and logic 804 (e.g., transistor array and other integrated circuit/IC components) coupled to the substrate(s) 802. In an embodiment, the logic 804 implements one or more aspects of the memory device 400 (FIGS. 4 and 6) already discussed.

In one example, the logic 804 includes transistor channel regions that are positioned (e.g., embedded) within the substrate(s) 802. Thus, the interface between the logic 804 and the substrate 802 may not be an abrupt junction. The logic 804 may also be considered to include an epitaxial layer that is grown on an initial wafer of the substrate 802.

Figure 9:
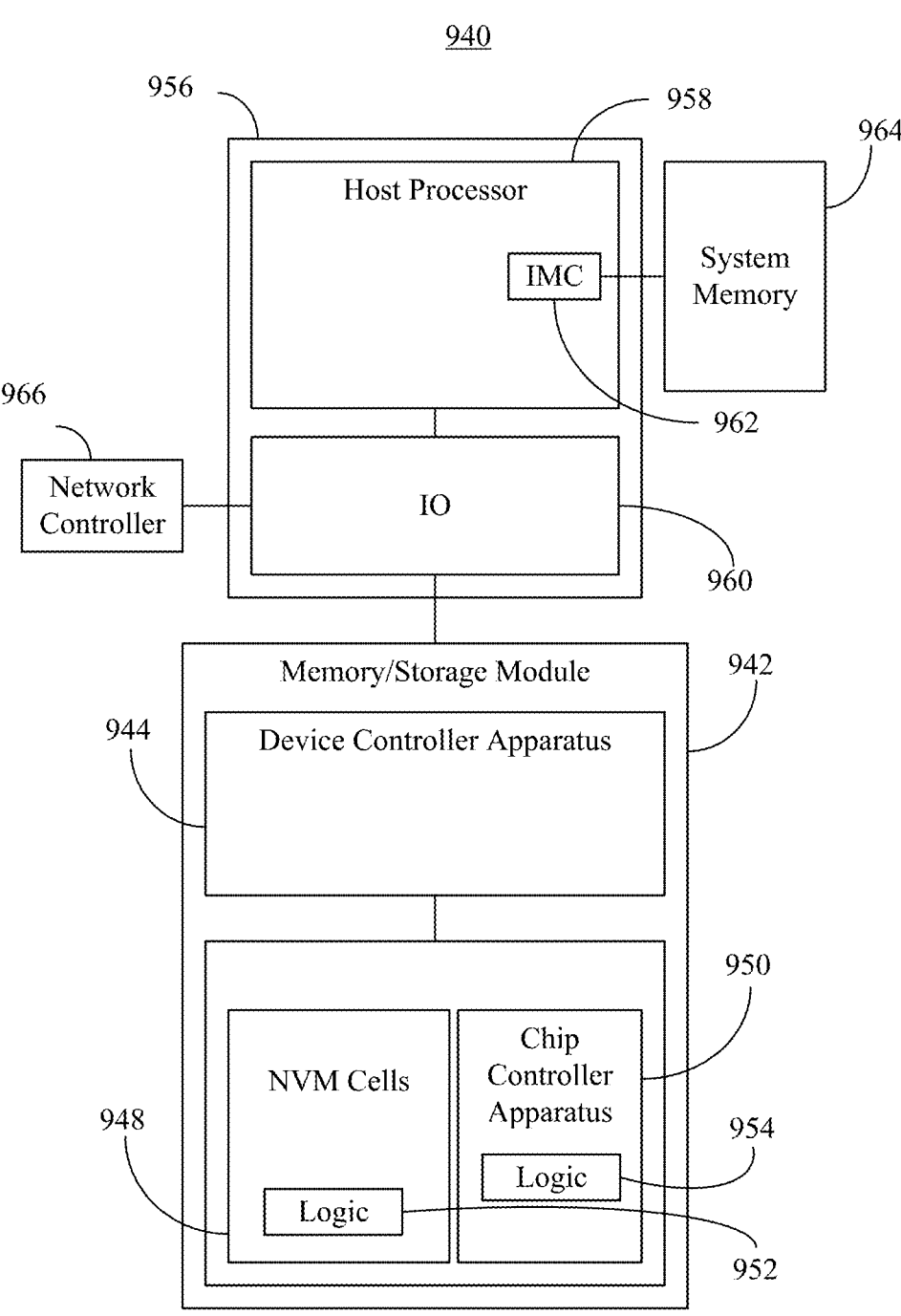
FIG. 9 is a block diagram of an example of a performance-enhanced computing system according to an embodiment.

Turning now to FIG. 9, a performance-enhanced computing system 940 is shown. In the illustrated example, a solid state drive (SSD) 942 includes a device controller apparatus 944 that is coupled to a NAND 946. The illustrated NAND 946 includes a memory device 948 having a set of multi-level NVM cells and logic 952 (e.g., transistor array and other integrated circuit/IC components coupled to one or more substrates containing silicon, sapphire and/or gallium arsenide), and a chip controller apparatus 950 that includes logic 954. The logic 954 may include one or more of configurable or fixed-functionality hardware.

The illustrated system 940 also includes a system on chip (SoC) 956 having a host processor 958 (e.g., central processing unit/CPU) and an input/output (I/O) module 960. The host processor 958 may include an integrated memory controller 962 (IMC) that communicates with system memory 964 (e.g., RAM dual inline memory modules/DIMMs). The illustrated IO module 960 is coupled to the SSD 942 as well as other system components such as a network controller 966.

In some embodiments, the NAND 946 implements one or more aspects of the memory device 400 (FIGS. 4 and 6)

already discussed. For example, the NAND 946 is implementable as a multi-deck non-volatile memory structure comprising a plurality of decks coupled to the device controller apparatus 944 (e.g., a memory controller).

ADDITIONAL NOTES AND EXAMPLES

Example 1 includes a memory device comprising: a memory array; a memory block coupled to the memory array, the memory block comprising: a first through array via area; and a first staircase area coupled to a plurality of decks, wherein the first staircase area comprises: a first stair well, and a second stair well located contiguous to the first stair well.

Example 2 includes the memory device of Example 1, wherein the first staircase area comprises a third stair well located contiguous to the first and second stair wells.

Example 3 includes the memory device of any one of Examples 1 to 2, wherein the first stair well is coupled exclusively to a first one of the plurality of decks, and wherein the second stair well is coupled exclusively to a second one of the plurality of decks, wherein the second stair well is different than the first stair well and the second one of the plurality of decks is different than the first one of the plurality of decks.

Example 4 includes the memory device of Example 3, further comprising: a second memory block coupled to the memory array, the second memory block comprising: a second through array via area; and a second staircase area coupled to the plurality of decks.

Example 5 includes the memory device of Example 4, wherein the first and second staircase areas and the first and second through array via areas form a sandwich structure with the first and second staircase areas located on an outside of the sandwich and the first and second through array via areas positioned adjacent one another on an inside of the sandwich.

Example 6 includes the memory device of Example 4, wherein the first and second staircase areas and the first and second through array via areas extend parallel to one another and perpendicular to the memory array.

Example 7 includes the memory device of any one of Examples 1 to 6, wherein the first through array via area comprises a plurality of string driver contacts, wherein the first staircase area comprises a plurality of word line contacts, and wherein a plurality of metal routers individually connect the plurality of word line contacts to the plurality of string driver contacts, and wherein the plurality of metal routers extend parallel to the memory array.

Example 8 includes a system comprising: a memory controller; and a multi-deck non-volatile memory structure coupled to the memory controller, the multi-deck non-volatile memory structure comprising a plurality of decks, multi-deck non-volatile memory structure comprising: a memory array; a memory block coupled to the memory array, the memory block comprising: a first through array via area; and a first staircase area coupled to the plurality of decks, wherein the first staircase area comprises: a first stair well, and a second stair well located contiguous to the first stair well.

Example 9 includes the system of Example 8, wherein the first staircase area comprises a third stair well located contiguous to the first and second stair wells.

Example 10 includes the system of any one of Examples 8 to 9, wherein the first stair well is coupled exclusively to a first one of the plurality of decks, and wherein the second stair well is coupled exclusively to a second one of the plurality of decks, wherein the second stair well is different than the first stair well and the second one of the plurality of decks is different than the first one of the plurality of decks.

Example 11 includes the system of Example 10, further comprising: a second memory block coupled to the memory array, the second memory block comprising: a second through array via area; and a second staircase area coupled to the plurality of decks.

Example 12 includes the system of Example 11, wherein the first and second staircase areas and the first and second through array via areas form a sandwich structure with the first and second staircase areas located on an outside of the sandwich and the first and second through array via areas positioned adjacent one another on an inside of the sandwich.

Example 13 includes the system of Example 11, wherein the first and second staircase areas and the first and second through array via areas extend parallel to one another and perpendicular to the memory array.

Example 14 includes the system of any one of Examples 8 to 13, wherein the first through array via area comprises a plurality of string driver contacts, wherein the first staircase area comprises a plurality of word line contacts, and wherein a plurality of metal routers individually connect the plurality of word line contacts to the plurality of string driver contacts, and wherein the plurality of metal routers extend parallel to the memory array.

Example 15 includes a method comprising: forming a memory block, the memory block comprising: a first through array via area; and a first staircase area coupled to a plurality of decks, wherein the first staircase area comprises: a first stair well, and a second stair well located contiguous to the first stair well; and forming a memory array coupled to the memory block.

Example 16 includes the method of Example 15, wherein the first staircase area comprises a third stair well located contiguous to the first and second stair wells.

Example 17 includes the method of one of Examples 15 to 16, wherein the first stair well is coupled exclusively to a first one of the plurality of decks, and wherein the second stair well is coupled exclusively to a second one of the plurality of decks, wherein the second stair well is different than the first stair well and the second one of the plurality of decks is different than the first one of the plurality of decks.

Example 18 includes the method of Example 17, further comprising: forming a second memory block coupled to the memory array, the second memory block comprising: a second through array via area; and a second staircase area coupled to the plurality of decks.

Example 19 includes the method of Example 18, wherein the first and second staircase areas and the first and second through array via areas form a sandwich structure with the first and second staircase areas located on an outside of the sandwich and the first and second through array via areas positioned adjacent one another on an inside of the sandwich, and wherein the first and second staircase areas and the first and second through array via areas extend parallel to one another and perpendicular to the memory array.

Example 20 includes the method of one of Examples 15 to 19, wherein the first through array via area comprises a plurality of string driver contacts, wherein the first staircase area comprises a plurality of word line contacts, and wherein a plurality of metal routers individually connect the plurality of word line contacts to the plurality of string driver contacts, and wherein the plurality of metal routers extend parallel to the memory array.

Example 21 includes an apparatus comprising means for performing the method of any one of Examples 15 to 20.

Example 22 includes a machine-readable storage comprising machine-readable instructions, which when executed, implement a method or realize an apparatus as claimed in any preceding claim.

Technology described herein therefore provides the capability to cut down the word line exit overhead. This is especially true for future advances where the number of tiers keep increasing node to node.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory device comprising:
a memory array including two memory portions separated by a separation area; and
two memory blocks disposed in the separation area, the two memory blocks coupled between the two memory portions, the two memory blocks further including:
a first memory block coupled to the memory array, the first memory block comprising:
a first through array via area; and
a first staircase area coupled to a plurality of decks, wherein the first staircase area comprises a first stair well and a second stair well located contiguous to the first stair well; and
a second memory block coupled to the memory array, the second memory block including a second staircase area having at least two contiguous stair wells.

2. The memory device of claim 1, wherein the first staircase area comprises a third stair well located contiguous to the first and second stair wells.

3. The memory device of claim 1, wherein the first stair well is coupled exclusively to a first one of the plurality of decks, and wherein the second stair well is coupled exclusively to a second one of the plurality of decks, wherein the second stair well is different than the first stair well and the second one of the plurality of decks is different than the first one of the plurality of decks.

4. The memory device of claim 3, the second memory block further comprising a second through array via area, wherein the second staircase area is coupled to the plurality of decks.

5. The memory device of claim 4, wherein the first and second staircase areas and the first and second through array via areas form a sandwich structure with the first and second staircase areas located on an outside of the sandwich structure and the first and second through array via areas positioned adjacent one another on an inside of the sandwich structure.

6. The memory device of claim 4, wherein the first and second staircase areas and the first and second through array via areas extend parallel to one another and perpendicular to the memory array.

7. The memory device of claim 1, wherein the first through array via area comprises a plurality of string driver contacts, wherein the first staircase area comprises a plurality of word line contacts, and wherein a plurality of metal routers individually connect the plurality of word line contacts to the plurality of string driver contacts, and wherein the plurality of metal routers extend parallel to the memory array.

8. A system comprising:

a memory controller; and a multi-deck non-volatile memory structure coupled to the memory controller, the multi-deck non-volatile memory structure comprising a plurality of decks, multi-deck non-volatile memory structure comprising:

a memory array including two memory portions separated by a separation area; and two memory blocks disposed in the separation area, the two memory blocks coupled between the two memory portions, the two memory blocks further including:

a first memory block coupled to the memory array, the first memory block comprising:

a first through array via area; and a first staircase area coupled to the plurality of decks, wherein the first staircase area comprises a first stair well and a second stair well located contiguous to the first stair well; and a second memory block coupled to the memory array, the second memory block including a second staircase area having at least two contiguous stair wells.

9. The system of claim 8, wherein the first staircase area comprises a third stair well located contiguous to the first and second stair wells.

10. The system of claim 8, wherein the first stair well is coupled exclusively to a first one of the plurality of decks, and wherein the second stair well is coupled exclusively to a second one of the plurality of decks, wherein the second stair well is different than the first stair well and the second one of the plurality of decks is different than the first one of the plurality of decks.

11. The system of claim 10, the second memory block further comprising a second through array via area, wherein the second staircase area is coupled to the plurality of decks.

12. The system of claim 11, wherein the first and second staircase areas and the first and second through array via areas form a sandwich structure with the first and second staircase areas located on an outside of the sandwich structure and the first and second through array via areas positioned adjacent one another on an inside of the sandwich structure.

13. The system of claim 11, wherein the first and second staircase areas and the first and second through array via areas extend parallel to one another and perpendicular to the memory array.

14. The system of claim 8, wherein the first through array via area comprises a plurality of string driver contacts, wherein the first staircase area comprises a plurality of word line contacts, and wherein a plurality of metal routers individually connect the plurality of word line contacts to the plurality of string driver contacts, and wherein the plurality of metal routers extend parallel to the memory array.

15. A method comprising:

forming a memory array, the memory array including two memory portions separated by a separation area; and forming two memory blocks disposed in the separation area, the two memory blocks coupled to the memory array and between the two memory portions, wherein forming the two memory blocks further includes:

forming a first memory block, the first memory block comprising:

a first through array via area; and a first staircase area coupled to a plurality of decks, wherein the first staircase area comprises a first stair well and a second stair well located contiguous to the first stair well; and forming a second memory block coupled to the memory array, the second memory block including a second staircase area having at least two contiguous stair wells.

16. The method of claim 15, wherein the first staircase area comprises a third stair well located contiguous to the first and second stair wells.

17. The method of claim 15, wherein the first stair well is coupled exclusively to a first one of the plurality of decks, and wherein the second stair well is coupled exclusively to a second one of the plurality of decks, wherein the second stair well is different than the first stair well and the second one of the plurality of decks is different than the first one of the plurality of decks.

18. The method of claim 17, wherein the second memory block further comprises a second through array via area, wherein the second staircase area is coupled to the plurality of decks.

19. The method of claim 18, wherein the first and second staircase areas and the first and second through array via areas form a sandwich structure with the first and second staircase areas located on an outside of the sandwich structure and the first and second through array via areas positioned adjacent one another on an inside of the sandwich structure, and wherein the first and second staircase areas and the first and second through array via areas extend parallel to one another and perpendicular to the memory array.

20. The method of claim 15, wherein the first through array via area comprises a plurality of string driver contacts, wherein the first staircase area comprises a plurality of word line contacts, and wherein a plurality of metal routers individually connect the plurality of word line contacts to the plurality of string driver contacts, and wherein the plurality of metal routers extend parallel to the memory array.

* * * * *